United States Patent [19]

Hamburgen et al.

[11] Patent Number: 5,203,401
[45] Date of Patent: Apr. 20, 1993

[54] WET MICRO-CHANNEL WAFER CHUCK AND COOLING METHOD

[75] Inventors: William R. Hamburgen, Menlo Park; John S. Fitch, Newark, both of Calif.

[73] Assignee: Digital Equipment Corporation, Maynard, Mass.

[21] Appl. No.: 888,040

[22] Filed: May 22, 1992

Related U.S. Application Data

[63] Continuation-in-part of Ser. No. 722,891, Jun. 28, 1991, Pat. No. 5,115,858.

[51] Int. Cl.⁵ .......................................... H01L 23/473
[52] U.S. Cl. ................................ 165/80.4; 165/80.5; 165/104.32; 165/917; 361/385
[58] Field of Search ................ 165/104.32, 917, 80.1, 165/80.2, 80.4, 80.5; 361/385; 324/158 F

[56] References Cited

U.S. PATENT DOCUMENTS

| | | | |
|---|---|---|---|
| 4,278,230 | 7/1981 | Allen | 165/104.32 |
| 4,287,941 | 9/1981 | Allen | 165/104.32 |
| 4,775,003 | 10/1988 | Koh | 165/80.5 |
| 4,897,762 | 1/1990 | Daikoku et al. | 165/80.4 |
| 5,088,006 | 2/1992 | Puerto et al. | 361/385 |

*Primary Examiner*—Albert W. Davis, Jr.
*Attorney, Agent, or Firm*—Flehr, Hohbach, Test, Albritton & Herbert

[57] ABSTRACT

A wet micro-channel wafer chuck (10) holds a semiconductor wafer 12 having a plurality of high powered chips (14) held in place with vacuum provided in the chuck (10). The chuck (10) has a plurality of micro-channels (16), which extend along cooling fins (18), on which the semiconductor wafer (12) rests when it is held in place on the chuck. A water supply manifold (20) extends perpendicular to the micro-channels (16) across the chuck (10). Water supply slot (22) extends upward from the water supply manifold into the micro-channels (16). Similarly, water exit slots (24) extend upward from water exit manifolds (26) into the micro-channels (16). Water (28) is delivered from pump (30) of an external recirculator/chiller (32) to the supply manifold (20) and into the many micro-channels (16) that pass under the wafer (12) under test. The water (28) leaves the micro-channels (16), enters the exit slots (24) and then the exit manifolds (26), from which it is returned to the recirculator/chiller (32). Reservoir or tank (34) of the recirculator/chiller (32) is connected to a regulated vacuum source (36). By applying a vacuum, the pressure in the cooling loop is lowered below atmospheric, and the wafer (12) under test is held against surface (38) of the chuck (10).

9 Claims, 4 Drawing Sheets

WET MICRO-CHANNEL WAFER CHUCK AND COOLING METHOD

ORIGIN OF THE INVENTION

This application is a continuation-in-part of commonly assigned Application Ser. No. 07/722,891, filed Jun. 28, 1991 in the names of John S. Fitch and William S. Hamburgen, entitled "Micro-Channel Wafer Cooling Chuck," which issued as U.S. Pat. No. 5,115,858 on May 26, 1992.

BACKGROUND OF THE INVENTION

1. Field of the Invention

The present invention relates generally to a chuck and a method for cooling a planar electronic substrate, such as a wafer comprised of a plurality of high powered semiconductor chips. More particularly, it relates to such a chuck and method in which the wafer is placed on the chuck and cooled by a combination of two ways: direct contact with flowing water or other coolant, and indirect cooling via conduction through a thin film of the coolant and into fin arrays in the chuck. Most especially, it relates to such a chuck and method in which the wafer is held onto the chuck by the liquid coolant, which is circulated at sub-atmospheric pressure.

2. Description of the Prior Art

Emitter coupled logic (ECL) integrated circuit chips dissipate substantial amounts of power. To enable testing (commonly called probing) ECL chips while still in wafer form, pulsed power testing is often used. The die site is probed, and power is supplied only for a fraction of a second. At 30 watts/cm$^2$ power dissipation, which is typical for ECL, the temperature of an isolated die rises at 300° C. per second. In reality, there is some heat sinking to adjacent silicon and to the wafer chuck of a probing station, so short tests can be run without burning up the chip.

Advanced ECL microprocessor chips now under development will have a much higher watt density of almost 100 watts/cm$^2$. Such microprocessor chips also have a clocking scheme that would complicate designing the chip for pulsed power testing. Tester software for pulsed power testing is also more complicated than is the case with continuous testing. Thus, it is desired to run the chip continuously at full power during probing. This problem is not unique to such ECL microprocessor chips. Such a capability is desirable in almost any high powered wafer probing application.

SUMMARY OF THE INVENTION

The parent application describes a wafer chuck and method in which separate sets of micro-channels in the chuck are used for providing a vacuum to hold the wafer on the chuck and to circulate water or other liquid coolant through the chuck. The present invention is an improvement to that design that allows a single set of micro-channels to be used both for holding the wafer in place with a vacuum and for circulating the water or other liquid coolant through the chuck and over the back of the wafer.

These and related problems may be solved and features may be obtained through use of the novel wet micro-channel wafer chuck herein disclosed. A chuck for cooling a planar electronic substrate in accordance with this invention has a body with a planar upper surface. A plurality of micro-channels extends into the body from the upper surface. The plurality of micro-channels are separated from one another by individual ones of a plurality of cooling fins. A liquid circulation system includes at least one liquid coolant supply manifold is positioned in the body to supply liquid coolant to the plurality of micro-channels. At least one liquid coolant exit manifold is positioned in the body to remove liquid coolant from the plurality of micro-channels. A source of a vacuum is connected at some point in the liquid circulation system.

A planar electronic substrate cooling method in accordance with this invention includes positioning the planar electronic substrate on a cooling chuck having a body and a planar upper surface with a plurality of micro-channels extending from the planar upper surface into the body. Liquid coolant is circulated in the micro-channels. A vacuum is applied to the liquid coolant in the micro-channels to apply force for holding the planar electronic substrate on the cooling chuck.

The attainment of the foregoing and related advantages and features of the invention should be more readily apparent to those skilled in the art, after review of the following more detailed description of the invention, taken together with the drawings, in which:

DETAILED DESCRIPTION OF THE INVENTION

Figure 1:
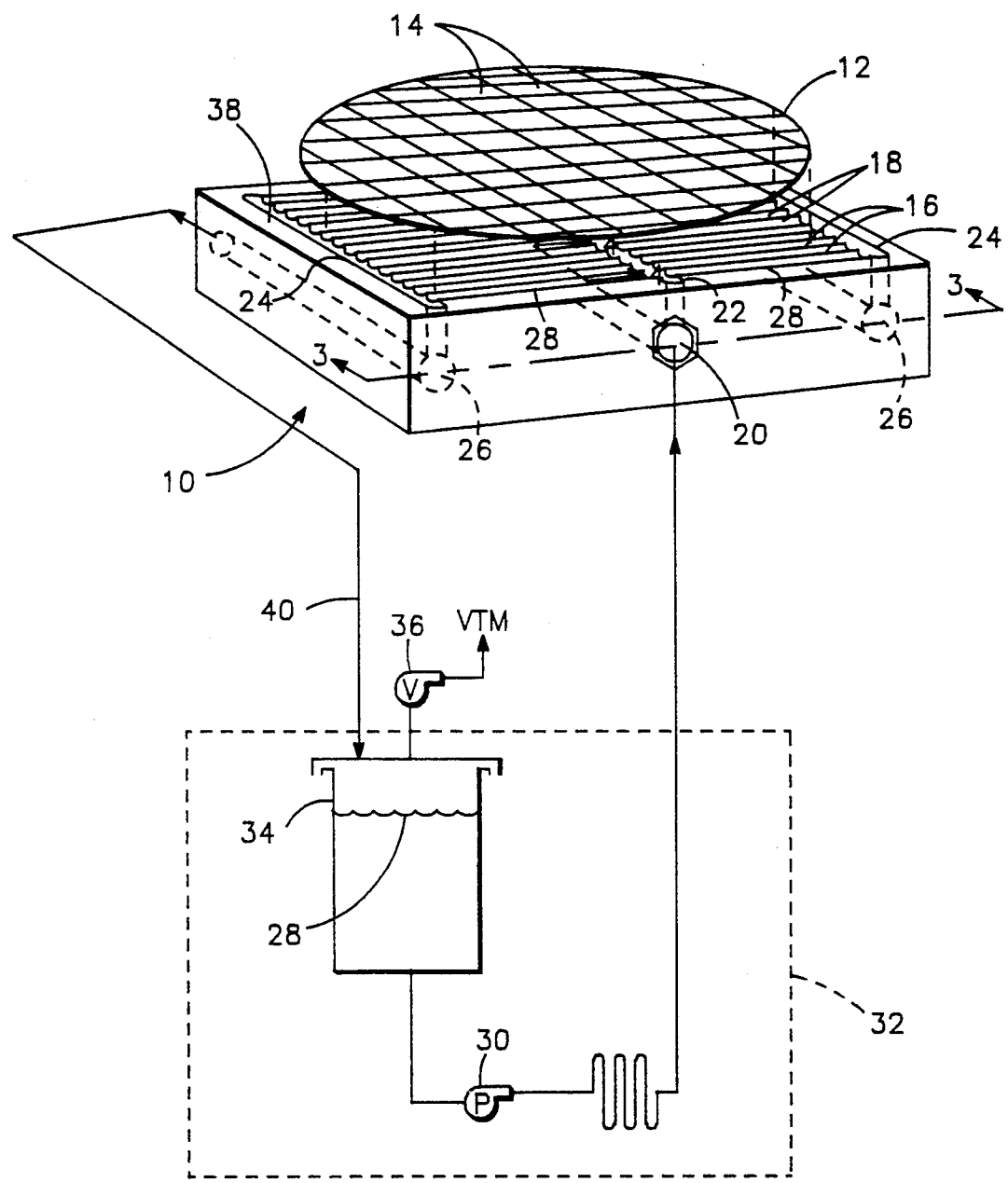
FIG. 1 is a partially perspective and partially block diagram view of a wet micro-channel wafer chuck in accordance with the invention.
Figure 2:
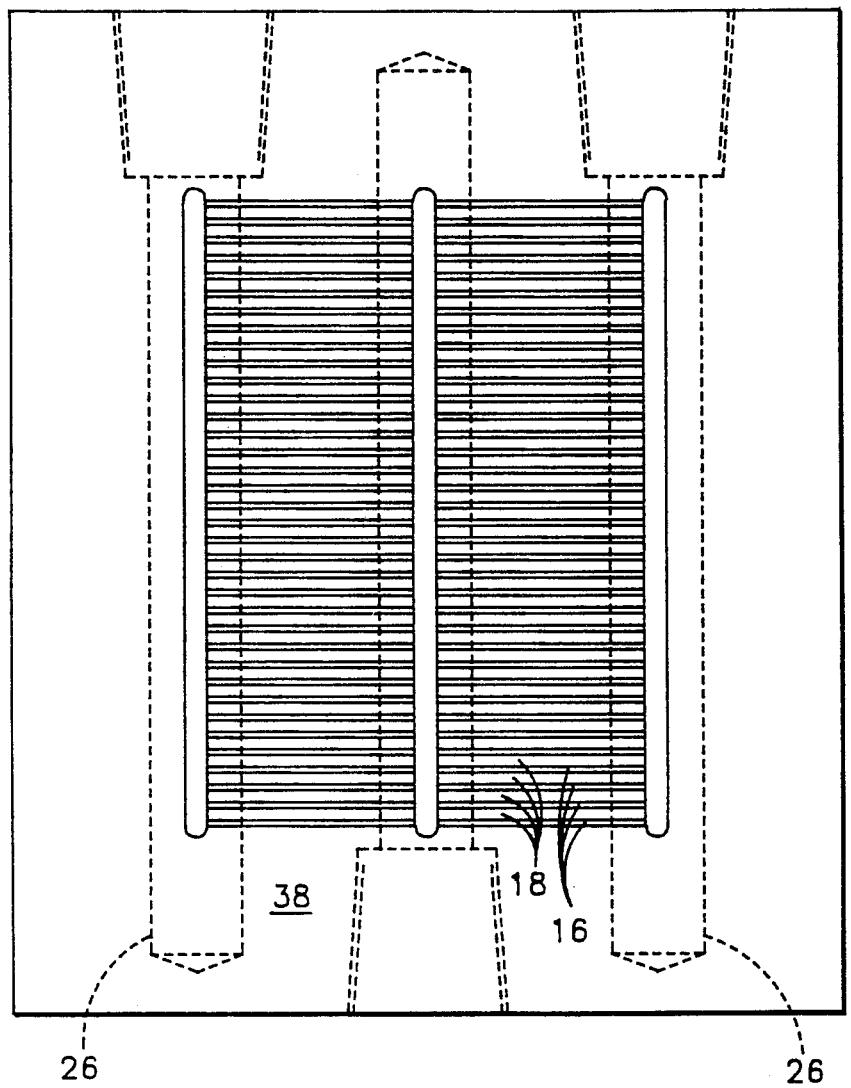
FIG. 2 is a plan view of the wet micro-channel wafer chuck of FIG. 1.
Figure 3:
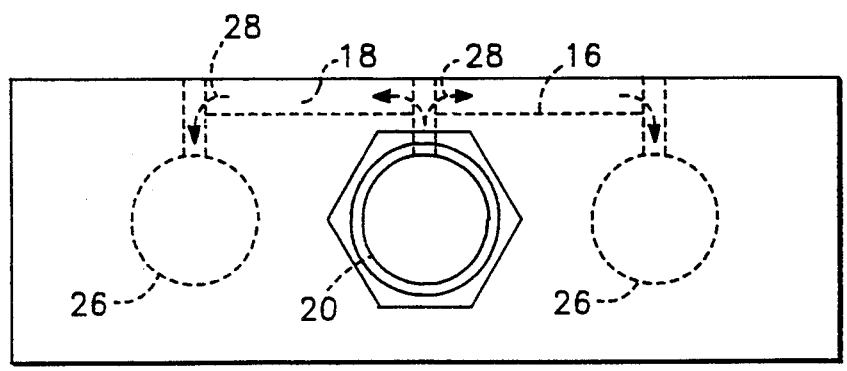
FIG. 3 is a cross-section view, taken along the line 3—3 in FIGS. 1 and 2.
Figure 4:
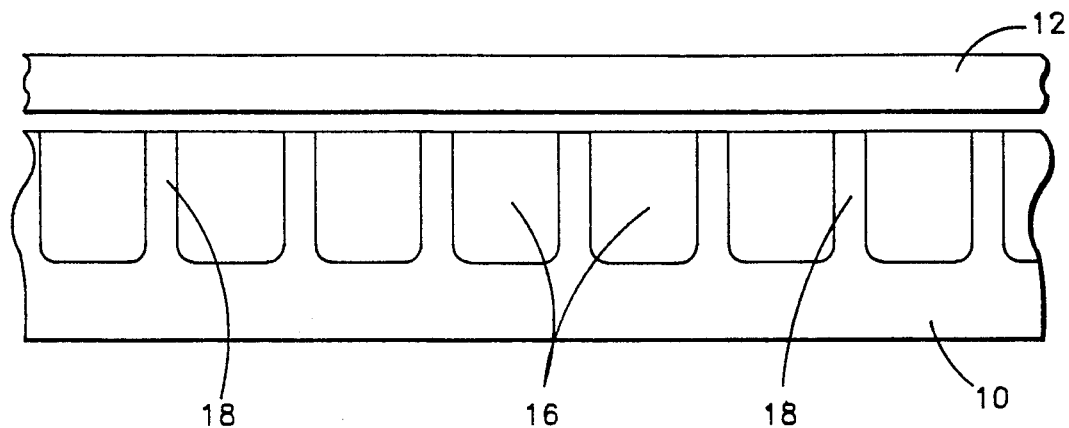
FIG. 4 is a cross-section view, taken along the line 4—4 in FIG. 1.

Turning now to the drawings, more particularly to FIGS. 1-4, there is shown a wet micro-channel wafer chuck 10, with a semiconductor wafer 12 having a plurality of ECL microprocessor chips 14 held in place with vacuum provided in the chuck 10. The chuck 10 has a plurality of micro-channels 16, which extend along cooling fins 18, on which the semiconductor wafer 12 rests when it is held in place on the chuck. A water supply manifold 20 extends perpendicular to the micro-channels 16 across the chuck 10. Water supply slot 22 extends upward from the water supply manifold into the micro-channels 16. Similarly, water exit slots 24 extend upward from water exit manifolds 26 into the micro-channels 16. For clarity, only one water supply manifold and two water exit manifolds 26 are shown. In practice, there are one or more of each manifold.

Water 28 is delivered from pump 30 of an external recirculator/chiller 32 to the supply manifold 20. The supply manifold in turn feeds the supply slot 22, which runs the length of the wafer 12. From the supply slot 22, water 28 is fed into the many micro-channels 16 that pass under the wafer 12 under test. The water 28 leaves the micro-channels 16, enters the exit slots 24 and then the exit manifolds 26, from which it is returned to the recirculator/chiller 32. The recirculator/chiller 32 includes a heat exchanger or refrigeration unit 33 connected between the pump 30 and the water supply manifold 20.

The particular arrangements of the manifolds 20 and 26, slots 22 and 24 and micro-channels 16 (all of which are shown schematically in FIG. 1) depend on which regions of the wafer 12 need to be cooled; active devices 14 never extend all the way to the edge of the wafer 12. Of course, the wafer 12 must cover entirely all of the coolant path openings in the surface of the chuck 10 in order to hold the wafer 12 in place and maintain a fluid seal.

Reservoir or tank 34 of the recirculator/chiller 32 is connected to a regulated vacuum source 36. By applying a vacuum, the pressure in the cooling loop is lowered below atmospheric, sufficiently that the wafer 12 under test is held against surface 38 of the chuck 10. If the vacuum source 36 creates an excessively low pressure in the reservoir 34, the coolant pump 30 may cavitate and coolant delivery cease. If, however, there is insufficient vacuum, or if the pump exit pressure is too high, the wafer 12 under test will not be held against the chuck 10 and water 28 will leak from the surface 38 of the chuck 10. These limitations mean that the pressure drop through the micro-channels 16 and exit lines 24, 26 and 40 must be less than approximately one atmosphere (14.7 psi). If desired, an open loop system for passing the water 28 through the wafer chuck 10 could be substituted for the closed loop system shown.

Correct sizing of the micro-channels 16 is critical for proper operation of the chuck 10. While the narrowest channels 16 offer the highest heat transfer, they also have higher pressure drops than wider channels 16. While the deepest channels 16 offer the largest surface area enhancement, and hence heat transfer, there is a point of diminishing returns, beyond which there is little improvement in heat transfer, but increased flow rate requirements. Finally, while shortening the channels 16 in the direction of fluid flow decreases pressure drop and improves heat transfer, the potential for shortening is limited both by the increased total flow rate requirement for the chuck 10, as well as the difficulty of manufacturing the manifolds 20 and 26 on close centers.

The correct fin 18 width is also important. Since the chuck 10 is never perfectly flat, heat is conducted from the wafer 12 under test into the fins 18 through a thin layer of water 28. The flatter and smoother the chuck 10, the thinner will be this water 28 layer, and the more closely the optimal fin 18 thickness will approach the value predicted by classical heat exchanger analysis. In a practical chuck 10, the fins 18 will be thicker than predicted by the analysis, on the order of twice the micro-channel 16 width. This is because thicker fins are necessary to establish good thermal contact with the wafer 12 when the wafer 12 and the chuck 10 vary from a flat configuration.

In a specific example, the chuck 10 had 0.016 inch wide by 0.09 inch deep by 0.53 inch long channels 16, with fin 18 thicknesses slightly larger than the channel width. Such a prototype cooled the surface of a 15 mm square diesite on a test wafer to below 70° C. with a water 28 inlet temperature of 25° C. and a 200 watt power input. Scaling to smaller channel 16 dimensions should yield improved performance, limited only by chuck 10 flatness, pressure drop and manufacturability constraints.

The chuck 10 obtains its improvement over a conventional chuck in three ways. First, the thermal conductivity of water 28 is about 20 times that of air, which is the gas between the wafer and the chuck in the conventional approach. Second, the use of micro-channels 16 offers higher heat transfer coefficients than the cast-in tubes usually found in conventional wafer chucks. Third, by allowing the coolant channels 16 and fins 18 to contact the wafer 12 under test directly, conduction losses through the chuck 10 are eliminated.

In practice, it is desired to have the lowest possible pressure drop on the water exit side of the chuck 10, because that is where the vacuum is applied. The pressure drop on the feed side does not matter. If necessary, an elevated pressure could be employed at the feed side in order to compensate for a substantial pressure drop on the feed side.

As shown, it is desirable that fins 18 not extend laterally beyond the opposite edge of the water exit slots 24. If necessary, electron discharge machining (EDM) is employed in order to obtain this configuration.

In use of the chuck 10, the improved heat transfer obtained with the chuck 10 means that continuous operating power can be applied to the ECL microprocessor chips 14 while the water 28 is circulated in the micro-channels 16 without causing excessive heat buildup in the chips 14.

Figure 5:
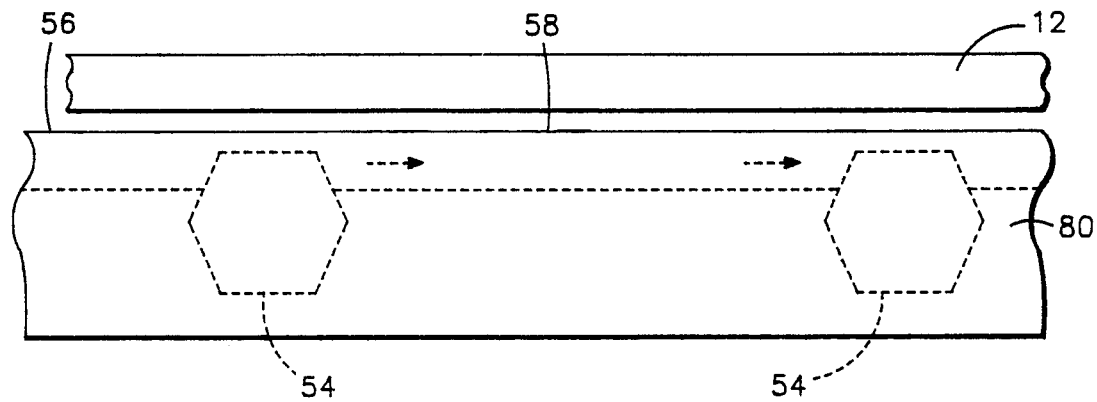
FIG. 5-8 are cross-section views, similar to FIG. 3, but of additional embodiments of wafer chucks in accordance with the invention.

Chuck 50 shown in FIG. 5 addresses the issue of diminished cooling in the wafer 12 in the region above the supply and exit slots 22 and 24 in the chuck 10 of FIGS. 1-4. Water supply manifold 52 and water exit manifold 54 are bored close to surface 56, so that the need for the supply and exit slots 22 and 24 in FIGS. 1-4 is eliminated. The entire surface of the chuck 50 is therefore covered with fins 58, and the formation of hot spots at the supply and exit slots 22 and 24 due to elimination of cooling fins 18 at the slot 22 and 24 locations is avoided. Other than as shown and described, the construction and operation of the FIG. 5 embodiment is the same as that of the FIGS. 1-4 embodiment.

Figure 6:
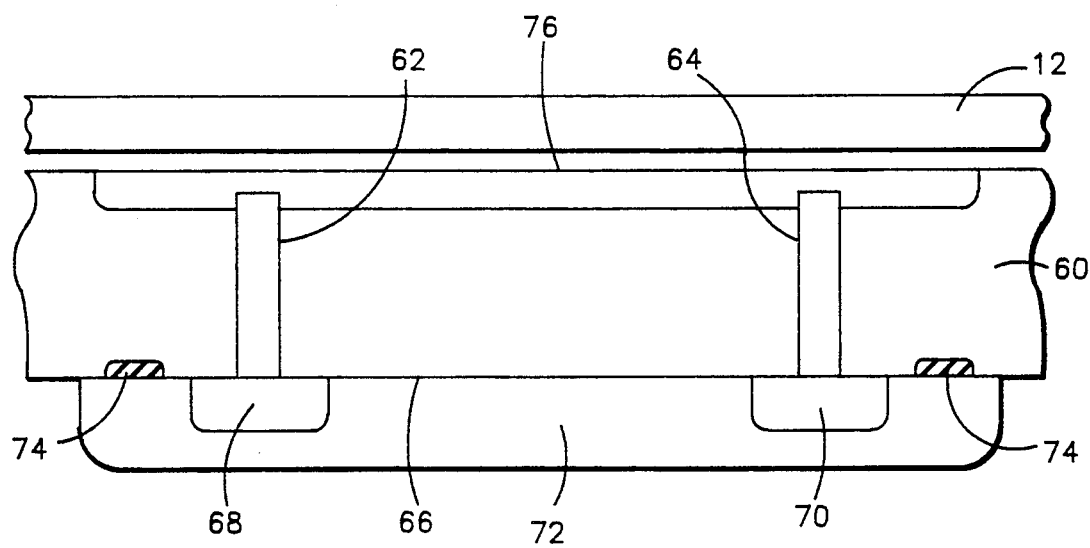

FIG. 6 shows another chuck 60 in which water supply and exit slots 62 and 64 are machined from back 66 of the chuck 60. Water supply and exit manifolds 68 and 70 are provided in a distribution cover 72. The distribution cover 72 and gasket 74 form a seal against the back 66 of the chuck 60. A flat gasket could also be used, or a permanent joint could be formed between the cover 72 and the back 66 of the chuck 66. As shown, this construction for the water supply and exit slots 62 and 64 allows part of cooling fins 76 to be maintained above the slots 62 and 64, thus minimizing any problem with hot spots at those locations on the chuck 60. The FIG. 6 embodiment allows shorter micro-channels 77 in the chuck 60 than micro-channels 59 in the chuck 50, because the manifolds 68 and 70 can be placed closer together than the manifolds 52 and 54. The FIG. 6 embodiment also allows the geometry at the supply and return slot 62 and 64 transitions with the micro-channels 77 to be easily optimized. Other than as shown and described, the construction and operation of the FIG. 6 embodiment is the same as that of the FIGS. 1-5 embodiments.

Figure 7:
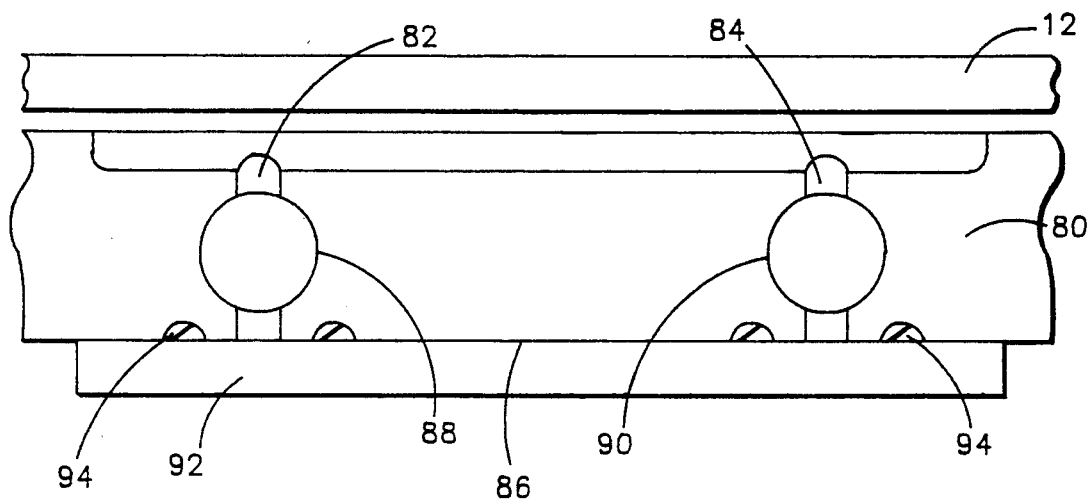

FIG. 7 shows chuck 80, a modified form of the chuck 60. In the chuck 80, water supply and exit slots 82 and 84 are machined from back 86 of the chuck 80, as in the FIG. 6 embodiment. Water supply and exit manifolds 88 and 90 are formed in the chuck 80 in the same manner as in the FIGS. 1-4 embodiments. A planar cover 92 having haskets 94 around the slots 82 and 84 is fastened in a seal against the back 86 of the chuck 80. Other than as shown and described, the construction and operation of the FIG. 7 embodiment is the same as that of the FIG. 6 embodiment.

Figure 8:
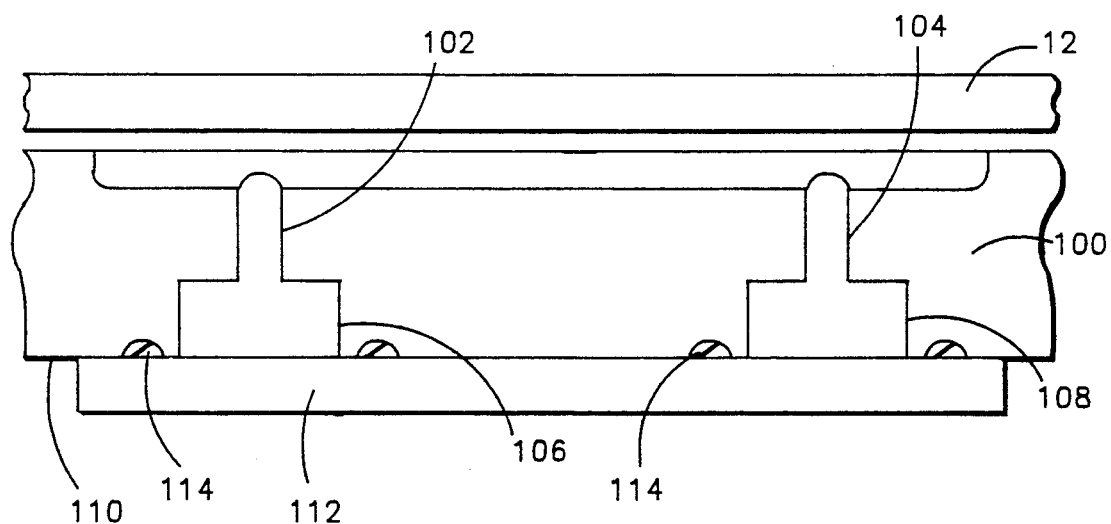

FIG. 8 shows another chuck 100, which is a modified form of the chuck 80, in which both water supply and exit slots 102 and 104 and water supply and exit manifolds 106 and 108 are machined from back 110 of the chuck 100. Planar cover 112 having gaskets 114 around the water supply and exit manifolds 106 and 108 is fastened in a seal against the back 110 of the chuck 100. Other than as shown and described, the construction and operation of the FIG. 8 embodiment of the invention is the same as that of the FIG. 7 embodiment.

It should be apparent to those skilled in the art that various changes in form and details of the invention as shown and described may be made. For example, a peripheral micro-channel or exit slot comparable to the water exit slots 24, 64 and 84 which is connected only to a source of vacuum might be provided in the chucks of FIGS. 1–8 in order to provide more secure retention of the wafer 12. It is intended that such changes be included within the spirit and scope of the claims appended hereto.

What is claimed is:

1. A chuck for cooling a planar electronic substrate which comprises a body having a planar upper surface, a plurality of micro-channels extending into said body from said planar upper surface, said plurality of micro-channels being separated from one another by individual ones of a plurality of cooling fins, a liquid coolant circulation system including at least one liquid coolant supply manifold positioned in said body to supply liquid coolant to said plurality of micro-channels and at least one liquid coolant exit manifold positioned in said body to remove liquid coolant from said plurality of micro-channels, and a source of a vacuum connected to said liquid coolant circulation system.

2. The chuck for cooling a planar electronic substrate of claim 1 in which said at least one liquid coolant supply manifold is connected to said plurality of micro-channels by at least one liquid supply slot and said at least one liquid coolant exit manifold is connected to said plurality of micro-channels by at least one liquid exit slot.

3. The chuck for cooling a planar electronic substrate of claim 2 in which said at least one liquid supply slot and said at least one liquid exit slot extend from a bottom surface of said body into said body to said plurality of micro-channels.

4. The chuck for cooling a planar electronic substrate of claim 1 in which said at least one liquid coolant supply manifold and said at least one liquid coolant exit manifold are directly connected to said plurality of micro-channels.

5. The chuck for cooling a planar electronic substrate of claim 1 in which said chuck is configured to hold a semiconductor wafer as the planar electronic substrate.

6. The chuck for cooling a planar electronic substrate of claim 1 in which said at least one liquid coolant supply manifold is connected to a source of water as the liquid coolant.

7. A method for cooling a planar electronic substrate, which comprises positioning the planar electronic substrate on a cooling chuck having a body and a planar upper surface with a plurality of micro-channels extending from the planar upper surface into the body, circulating liquid coolant in the micro-channels, and applying a vacuum to the liquid coolant in the micro-channels to apply force for holding the planar electronic substrate on the cooling chuck.

8. The method for cooling a planar electronic substrate of claim 7 in which the plurality of micro-channels are connected to a source of water as the liquid coolant.

9. The method for cooling a planar electronic substrate of claim 7 additionally comprising the step of applying continuous operating power to the planar electronic substrate while the liquid coolant is circulated in the micro-channels.

* * * * *